(12) United States Patent
Sakai et al.

(10) Patent No.: US 12,283,945 B2
(45) Date of Patent: Apr. 22, 2025

(54) DRIVE CIRCUIT FOR SEMICONDUCTOR SWITCHING DEVICE

(71) Applicant: Mitsubishi Electric Corporation, Tokyo (JP)

(72) Inventors: Takuya Sakai, Tokyo (JP); Kohei Onda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 13 days.

(21) Appl. No.: 18/274,724

(22) PCT Filed: Feb. 17, 2021

(86) PCT No.: PCT/JP2021/005826
§ 371 (c)(1),
(2) Date: Jul. 28, 2023

(87) PCT Pub. No.: WO2022/176040
PCT Pub. Date: Aug. 25, 2022

(65) Prior Publication Data
US 2024/0128966 A1    Apr. 18, 2024

(51) Int. Cl.
*H03K 17/082* (2006.01)
*H03K 17/16* (2006.01)
*H03K 17/08* (2006.01)

(52) U.S. Cl.
CPC ....... *H03K 17/0828* (2013.01); *H03K 17/168* (2013.01); *H03K 2017/0806* (2013.01)

(58) Field of Classification Search
CPC ............ H03K 17/0828; H03K 17/168; H03K 2017/0806; H03K 2217/0027;
(Continued)

(56) References Cited

U.S. PATENT DOCUMENTS

| 2003/0086227 A1 | 5/2003 | Coiret et al. |
| 2008/0070749 A1 | 3/2008 | Schnitzer |

(Continued)

FOREIGN PATENT DOCUMENTS

| CN | 101478143 A | 7/2009 |
| CN | 104052048 A | 9/2014 |

(Continued)

OTHER PUBLICATIONS

International Search Report and Written Opinion mailed on Apr. 27, 2021, received for PCT Application PCT/JP2021/005826, filed on Feb. 17, 2021, 12 pages including English Translation.

(Continued)

*Primary Examiner* — Jung Kim
(74) *Attorney, Agent, or Firm* — XSENSUS LLP

(57) ABSTRACT

A detection circuit is provided to output a feedback signal and a adjustment current when a voltage of a high-voltage side main terminal of a semiconductor switching device is equal to or higher than a preset threshold value in a period in which a gate drive circuit turns off the semiconductor switching device to cut off a current, a control circuit diagnoses a state of the semiconductor switching device or controls a signal to be outputted to the gate drive circuit, on the basis of the feedback signal, and a gate current, which is an output of the gate drive circuit, is adjusted by the adjustment current.

20 Claims, 12 Drawing Sheets

(58) Field of Classification Search
CPC .. H03K 17/082; H03K 17/08; H03K 17/6871; H03K 17/687; H03K 17/693; H03K 17/6271; H03K 17/6285; H03K 17/04206; H03K 17/04213; H03K 17/145; H03K 17/161; H03K 17/284; H03K 17/302; H03K 17/567; H03K 17/60

See application file for complete search history.

(56) References Cited

U.S. PATENT DOCUMENTS

| | | | |
|---|---|---|---|
| 2010/0033230 A1 | 2/2010 | Lueders et al. | |
| 2015/0042397 A1* | 2/2015 | Mathieu | H03K 17/0828 327/381 |

FOREIGN PATENT DOCUMENTS

| | | | |
|---|---|---|---|
| CN | 104702252 | A | 6/2015 |
| CN | 108387830 | A | 8/2018 |
| CN | 211089463 | U | 7/2020 |
| GB | 2533677 | A | 6/2016 |
| JP | 2003-199325 | A | 7/2003 |
| JP | 2008-539625 | A | 11/2008 |
| JP | 2014-138476 | A | 7/2014 |
| JP | 2015-115975 | A | 6/2015 |
| JP | 2016-086490 | A | 5/2016 |
| JP | 2017-050804 | A | 3/2017 |
| JP | 2019-135884 | A | 8/2019 |

OTHER PUBLICATIONS

Notice of Reasons for Refusal mailed on Dec. 14, 2021, received for JP Application 2021-552154, 13 pages including English Translation.

Decision of Refusal mailed on Apr. 26, 2022, received for JP Application 2021-552154, 13 pages including English Translation.

Notice of Reasons for Refusal mailed on Feb. 21, 2023, received for JP Application 2022-115289, 12 pages including English Translation.

* cited by examiner

DRIVE CIRCUIT FOR SEMICONDUCTOR SWITCHING DEVICE

CROSS-REFERENCE TO RELATED APPLICATION

The present application is based on PCT filing PCT/JP2021/005826, filed Feb. 17, 2021, the entire contents of which are incorporated herein by reference.

TECHNICAL FIELD

The present application relates to a drive circuit for a semiconductor switching device.

BACKGROUND ART

In a semiconductor switching apparatus constituting a power conversion device or the like, a semiconductor switching device such as an insulated gate bipolar transistor (hereinafter, referred to as IGBT) or a metal oxide semiconductor field effect transistor (hereinafter, referred to as MOSFET) having a MOS gate structure is widely used.

With implementation of semiconductor switching devices using new materials, a trade-off among a switching loss, noise, a surge voltage, and the like has been an important issue. Further, the development of predictive maintenance technology and failure location diagnosis technology for power modules has been advanced in response to the need to reduce downtime in recent years.

For example, in Patent Document 1, in a protection circuit for a semiconductor switch with current sensing, an overcurrent anomaly and an open failure are detected on the basis of voltage Vce between both ends (between a collector and an emitter) of an IGBT, a collector current Ic, and an emitter-gate voltage Vge, and a predetermined protection operation is performed.

PRIOR ART DOCUMENT

Patent Document

Patent Document 1: Japanese Unexamined Patent Application Publication No. 2017-50804

SUMMARY OF INVENTION

Problems to be Solved by Invention

With an increase in the capacity of a power supply, an increasing number of switching devices are configured to be in multiple stage arrangement or in multiple parallel arrangement, and thus it is necessary to optimize the drive condition of each switching device and to detect which device has failed or deteriorated. In a conventional typical failure diagnosis method, the collector current Ic, the collector-emitter voltage Vce, or the emitter-gate voltage Vge of each switching device is individually detected, and thus a problem arises in that the circuit configuration becomes complicated.

In addition, in the protection circuit for the semiconductor switch disclosed in Patent Document 1, the voltage Vce of the IGBT as an output signal binarized by a both-end voltage detection circuit is inputted to a comparator together with a threshold value. In the method of performing the binary determination of the voltage Vce as in Patent Document 1, prediction of the open failure, maintenance at the time of device deterioration, and diagnosis for a partial failure in a parallel module or the like cannot be performed.

The present application discloses a technique for solving the above-described problems, and an object of the present application is to provide a drive circuit for a semiconductor switching device, which is capable of diagnosing a failure and deterioration of the semiconductor switching device with a simple circuit configuration and obtaining appropriate switching characteristics.

Means for Solving Problems

A drive circuit for a semiconductor switching device disclosed in the present application includes a control circuit to output a drive signal to the semiconductor switching device in synchronization with an input signal, a gate drive circuit to drive the semiconductor switching device on a basis of the drive signal, and a detection circuit to output a feedback signal and an adjustment current when a voltage of a high-voltage side main terminal of the semiconductor switching device is equal to or higher than a preset threshold value in a period in which the gate drive circuit turns off the semiconductor switching device to cut off a current, wherein the control circuit diagnoses a state of the semiconductor switching device or controls a signal to be outputted to the gate drive circuit on a basis of the feedback signal, and a gate current that is an output of the gate drive circuit is adjusted by the adjustment current.

Effect of Invention

According to the drive circuit of the semiconductor switching device disclosed in the present application, the detection circuit outputs the feedback signal based on the voltage of the feedback part of the semiconductor switching device, and the control circuit diagnoses the deterioration and failure of the semiconductor switching device on the basis of the feedback signal, so that it is possible to detect the deterioration and failure of the semiconductor switching device with a simple circuit configuration. Further, the signal to the gate drive circuit is controlled on the basis of the feedback signal, and the gate current is adjusted by the adjustment current, so that appropriate switching characteristics can be obtained. Other objects, features, aspects, and advantages of the present application will be more apparent from the following detailed descriptions with reference to the drawings.

MODES FOR CARRYING OUT INVENTION

Embodiment 1

Figure 1:
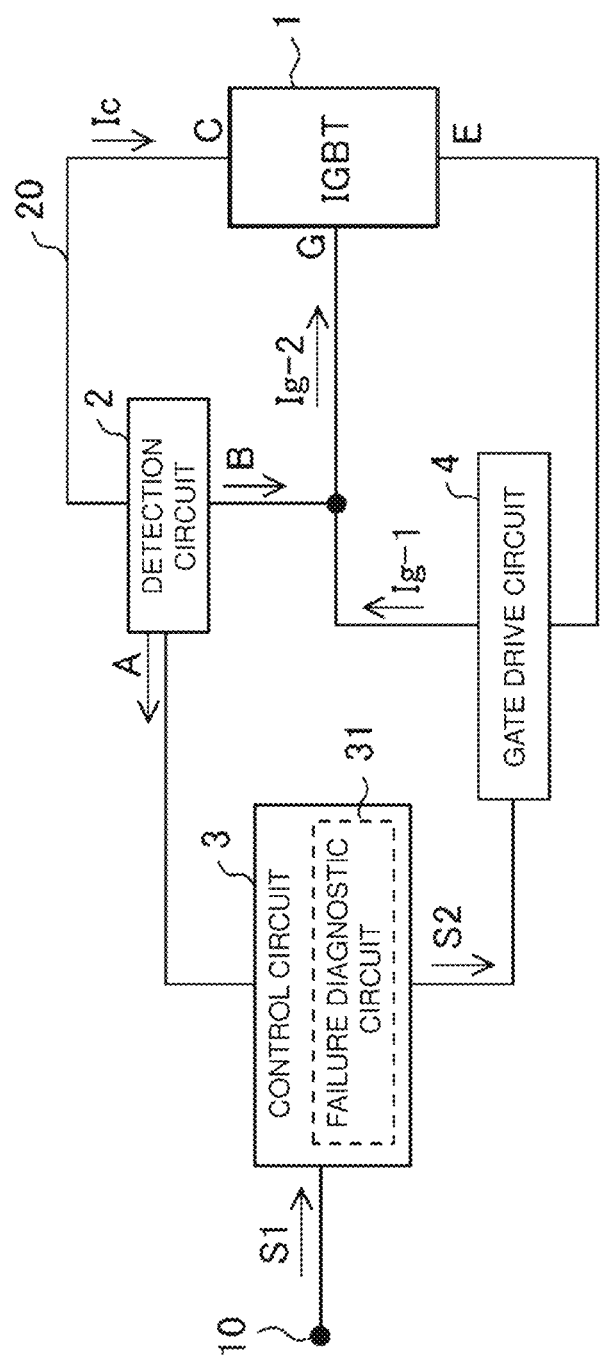
FIG. 1 is a block diagram showing a configuration of a drive circuit for a semiconductor switching device according to Embodiment 1.
Figure 2:
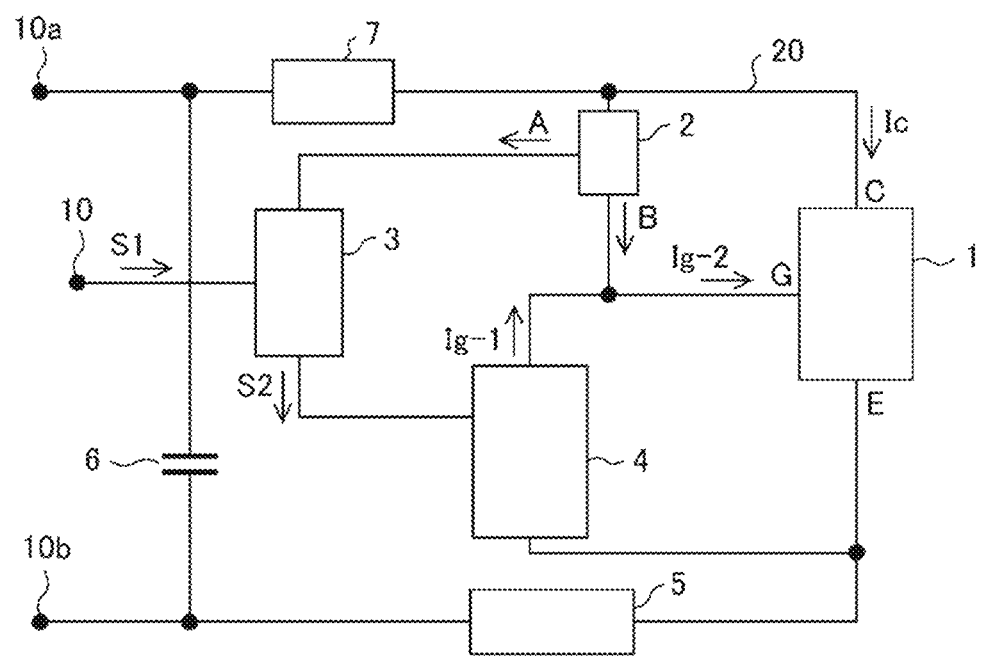
FIG. 2 is a diagram showing a usage example of the drive circuit for the semiconductor switching device in Embodiment 1.
Figure 3:
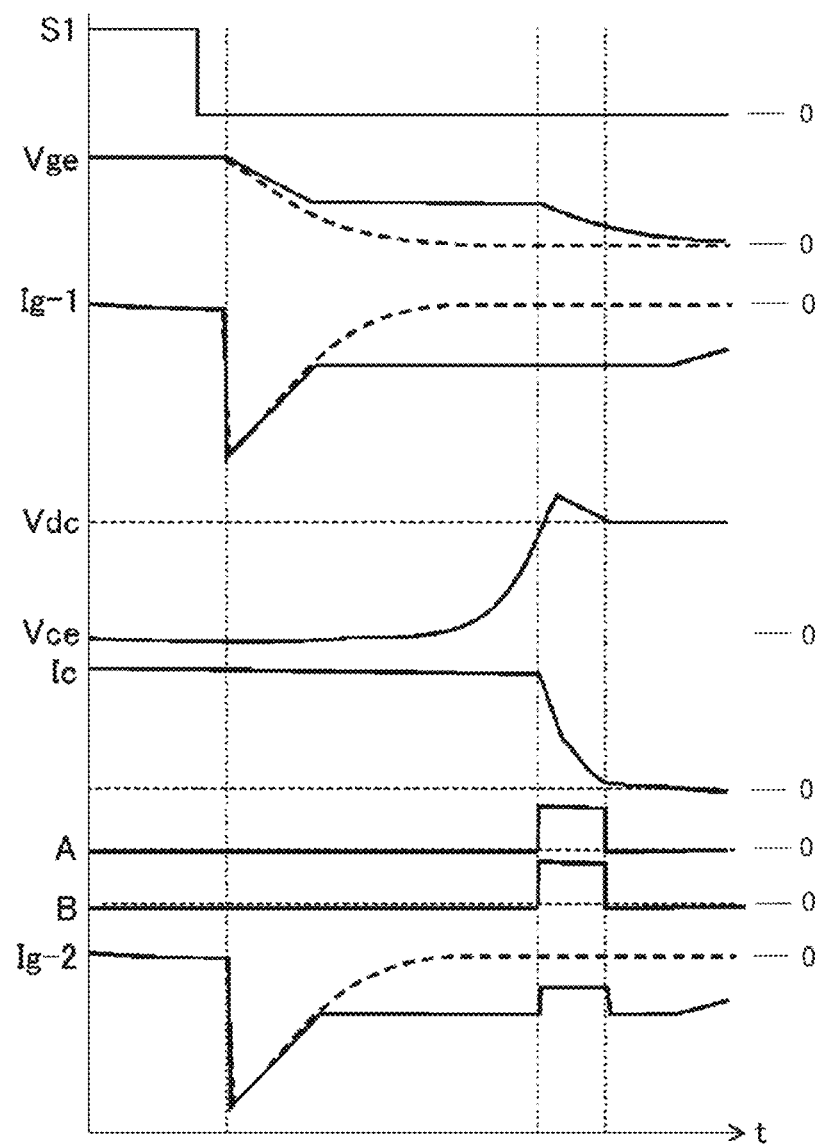
FIG. 3 is a diagram showing a waveform in each of parts in the drive circuit for the semiconductor switching device in Embodiment 1.

A drive circuit for a semiconductor device according to Embodiment 1 will be described below with reference to the drawings. FIG. 1 is a block diagram showing a configuration of the drive circuit for the semiconductor device according to Embodiment 1. FIG. 2 is a diagram showing a usage example of the drive circuit for the semiconductor device according to Embodiment 1, and FIG. 3 is a diagram showing a waveform of each of parts in the drive circuit for the semiconductor device according to Embodiment 1. In the drawings, the same or corresponding parts are denoted by the same reference numerals.

In the following description, a case where an IGBT is used as a semiconductor device will be described, but the semiconductor device is not limited to the IGBT and may be other semiconductor devices, for example, a MOSFET. An IGBT 1, which is a power semiconductor device, has a pair of main terminals, i.e., an emitter (E) and a collector (C), through which a main current flows, and a gate (G), which is a control terminal, and the gate controls opening or closing between the main terminals.

As shown in FIG. 1, the detection circuit 2 is connected to the collector, which is a high-voltage side main terminal of the IGBT 1 in the semiconductor device, detects a voltage of a feedback part 20 of the IGBT 1, that is, a collector-gate voltage Vcg (hereinafter, referred to as a voltage Vcg), and outputs a feedback signal A and an adjustment current B in accordance with the voltage Vcg. In Embodiment 1, the feedback signal A is outputted to a control circuit 3, and the adjustment current B is outputted to the gate of the IGBT 1.

The control circuit 3 receives a switching signal S1, which is an input signal, from an input terminal 10, and generates an on/off signal S2, which is a drive signal for the IGBT 1, in synchronization with the switching signal S1. Further, the control circuit 3 adjusts the timing and magnitude of the on/off signal S2 on the basis of the feedback signal A, and adjusts the timing and magnitude of a gate current of the IGBT 1.

The control circuit 3 detects from the feedback signal A that the adjustment current B has been outputted, and detects that the switching of the IGBT 1 has been performed. Note that the control circuit 3 can calculate the magnitude of the adjustment current B on the basis of the feedback signal A.

The control circuit 3 includes a failure diagnostic circuit 31 that diagnoses the state of the IGBT 1, such as deterioration and failure of the IGBT 1, on the basis of the feedback signal A. Note that the diagnosis of the state herein includes detection of the deterioration and the failure, and prediction of the failure or a service life. When the failure diagnostic circuit 31 detects a failure of the IGBT 1, the control circuit 3 outputs a failure signal (not shown) to the outside. Note that, in the following description, the control circuit 3 and the failure diagnostic circuit 31 are not particularly distinguished from each other, and the function and operation of the control circuit 3 will be described.

A gate drive circuit 4 controls a gate waveform of the IGBT 1 on the basis of the on/off signal S2 outputted from the control circuit 3, and drives the IGBT 1. The emitter of the IGBT 1 is at a reference potential of the gate drive circuit 4, and a gate current Ig-1 is outputted to the gate of the IGBT 1. The adjustment current B outputted from the detection circuit 2 is also inputted to the gate of the IGBT 1, and the gate current Ig-1 is adjusted by the adjustment current B and is supplied to the gate as a gate current Ig-2.

For the control circuit 3, a digital circuit (D/A) capable of controlling an output waveform by an external signal or a circuit in which an output waveform can be adjusted by a logic circuit using a CR time constant, a logic IC, or the like is used. For the gate drive circuit, a circuit such as an amplifier circuit using an operational amplifier or a complementary transistor, or a Pulse-Width Modulation (PWM) circuit, a circuit in which an output current is controlled by the circuit, an output voltage, and a gate resistance, or a circuit in which an output current is limited by switching a constant current diode or the like on the basis of the on/off signal S2 is used.

FIG. 2 shows an example in which the IGBT 1 is used in a switching power supply as a usage example of the drive circuit of the switching device according to Embodiment 1. The emitter of the IGBT 1 is connected to a load 5, and the load 5 is connected to a bus capacitor 6. Both ends of the bus capacitor 6 are connected to input terminals 10*a* and 10*b*, respectively, which are connected to an external power supply (not shown). The input terminal 10*a*, which is not connected to the load 5, is connected to the collector of the IGBT 1.

Note that a wire inductor 7 is the wire inductor of the entire path and is collectively illustrated between the bus capacitor 6 and the collector of the IGBT 1. The detection circuit 2 that detects the voltage Vcg is connected in a part between the collector and the gate, which is the feedback part 20 of the IGBT 1, and outputs the feedback signal A in accordance with the magnitude of the voltage Vcg.

To the control circuit 3, the switching signal S1 is inputted from the outside, and the feedback signal A is inputted from the detection circuit 2. The control circuit 3 generates the on/off signal S2 on the basis of these signals, and outputs the on/off signal S2 to the gate drive circuit 4. The gate drive circuit 4 outputs the gate current Ig-1 for controlling a gate-emitter voltage (hereinafter, voltage Vge) of the IGBT 1 on the basis of the on/off signal S2.

The gate current Ig-2 supplied to the gate of the IGBT 1 is controlled by the gate current Ig-1 from the gate drive circuit 4 and the adjustment current B from the detection circuit 2. That is, the switching of the IGBT 1 is basically performed by the gate current Ig-1, and the speed of the switching is adjusted by the adjustment current B in accordance with the state of the switching.

FIG. 3 shows a waveform in each of parts at the off time of the switching signal S1. Note that, the same vertical axis is used here for the sake of simplicity in order to compare waveforms of respective parts, and S1 represents the switching signal, Vge represents the gate-emitter voltage, Ig-1 represents the gate current output from the gate drive circuit 4, Vdc represents a DC bus voltage, Vce represents the collector-emitter voltage, Ic represents the collector current, A represents the feedback signal, B represents the adjustment current, and Ig-2 represents the gate current after the adjustment, in the order from the top. Note that, in FIG. 3, portions in the waveforms indicated by a dotted line indicate waveforms when the IGBT 1 is in an open failure.

Using FIG. 3, a diagnosis method when the IGBT 1 has an open failure will be described. The control circuit 3 detects the presence or absence of the feedback signal A in a period in which the gate drive circuit 4 turns off the IGBT 1 to cut off the current, and diagnoses that the IGBT 1 has an open failure when the feedback signal A is not detected. When detecting the failure of the IGBT 1, the control circuit 3 holds the output of the gate drive circuit 4 in the off state.

Normally, a threshold value of the detection circuit 2 is set to a specific protection voltage, for example, an upper limit of the voltage Vce at the time of switching of a steady-state load current, or the like, but here, a case in which the DC bus voltage Vdc (hereinafter, voltage Vdc) is set as the threshold value in order to simplify the circuit operation will be described. That is, the detection circuit 2 outputs the feedback signal A and the adjustment current B when the voltage Vce exceeds the voltage Vdc. Note that the voltage detected by the detection circuit 2 is the collector-gate voltage Vcg as shown in FIG. 1 and FIG. 2, but the value of the gate voltage Vge is negligibly small as compared with the value of the collector-emitter voltage Vce when the IGBT 1 is turned off. Therefore, when the IGBT 1 starts to be turned off, the detection of the voltage Vcg by the detection circuit 2 is equivalent to the detection of the voltage Vce.

In the waveform in the normal state, when the voltage Vce reaches the voltage Vdc in the mirror period, the collector current Ic of the IGBT 1 starts to be cut off. Since an induced voltage is generated at both ends of the wire inductor 7 due to a current change rate dIc/dt at the time, the voltage Vce increases. The detection circuit 2 detects that the voltage Vce exceeds the voltage Vdc, and outputs the adjustment current B to the gate. As shown in FIG. 3, the adjustment current B is a positive current, namely, a current for sending electric charges to the gate, and the gate current Ig-1 output from the gate drive circuit 4 at the off time is a negative current, namely, a current for drawing electric charges from the gate. Accordingly, the adjusted gate current Ig-2 in its absolute value is controlled to have a value smaller than that of the gate current Ig-1 outputted from the gate drive circuit, and the voltage change rate dVce/dt is suppressed to be small, thereby suppressing the surge voltage caused by a stray inductance of the wiring to suppress the surge voltage generated in Vce.

The control circuit 3 detects by the feedback signal A from the detection circuit 2 that the adjustment current B has been outputted and detects that the switching of the IGBT 1 has been performed normally. As described above, normally at the off time, the switching speed is controlled by the voltage Vce, and the current change rate dIc/dt is controlled by the adjustment current B so as to minimize the switching loss.

In order to avoid erroneous detection, when a current flows through a freewheeling diode (not shown) connected in parallel to the IGBT 1 at the freewheeling period or the like, the current is separately measured and detected. At this time, since the direction of Ic or the magnitude of Ic does not greatly change at the timing of switching off, the feedback signal A is not outputted at the timing of switching off even in a normal state. The current direction at the off time can be detected by a method of detecting the voltage Vce, a method of detecting the current of a sense cell, a method of detecting the current of the diode, or the like, and these methods can avoid erroneous detection at the time of failure, but a description thereof will be omitted here.

Next, an operation at the time of a failure will be described. The control circuit 3 can detect a state in which switching is not performed even when the gate signal is inputted, by the presence or absence of the feedback signal A at the time of switching off. When the IGBT 1 has an open failure, the collector current Ic does not flow and the voltage Vce maintains the magnitude of the voltage Vdc. Therefore, the detection circuit 2 does not detect that the voltage Vce exceeds the voltage Vdc, and the adjustment current B is not outputted. Thus, the control circuit 3 diagnoses that the IGBT 1 has the open failure in the case where the control circuit 3 outputs the off signal, and the feedback signal A is not detected in a period in which the IGBT 1 cuts off the current.

Note that, although in FIG. 3, the open failure is described as an example, the control circuit 3 can detect a change in the dynamic switching characteristics of the IGBT 1 or can estimate one or both of the magnitude and the change rate of the current flowing through the IGBT 1, on the basis of the feedback signal A. Therefore, the control circuit 3 can diagnose failures or deterioration other than the open failure. For example, a delay time from the output of the on/off signal S2 in the switching of the IGBT 1 is estimated on the basis of the feedback signal A, and when the delay time is longer than a set value, it is diagnosed that the IGBT 1 or a mechanism for connecting those such as an aluminum wire or solder is deteriorated. For example, when a part of aluminum wire is disconnected due to deterioration of the wire, the wire inductor 7 becomes large in the inductance and the feedback signal A is changed, so that the deterioration in the chip constituting the IGBT 1 or in the wire can be detected by detecting the change.

As described above, according to the drive circuit of the semiconductor switching device in Embodiment 1, even if the collector current Ic, the voltage Vce, and the like of the IGBT 1 are not directly monitored, the open failure of the IGBT 1 can be detected by the presence or absence of the feedback signal A outputted from the detection circuit 2, and the failure of the IGBT 1 can be detected with a simple circuit configuration. In addition, since the gate current Ig-1 is adjusted by the adjustment current B outputted from the detection circuit 2, it is possible to improve the trade-off in the switching, to appropriately maintain the switching characteristics of the IGBT 1, and to perform maintenance at the time of deterioration.

Embodiment 2

Figure 4:
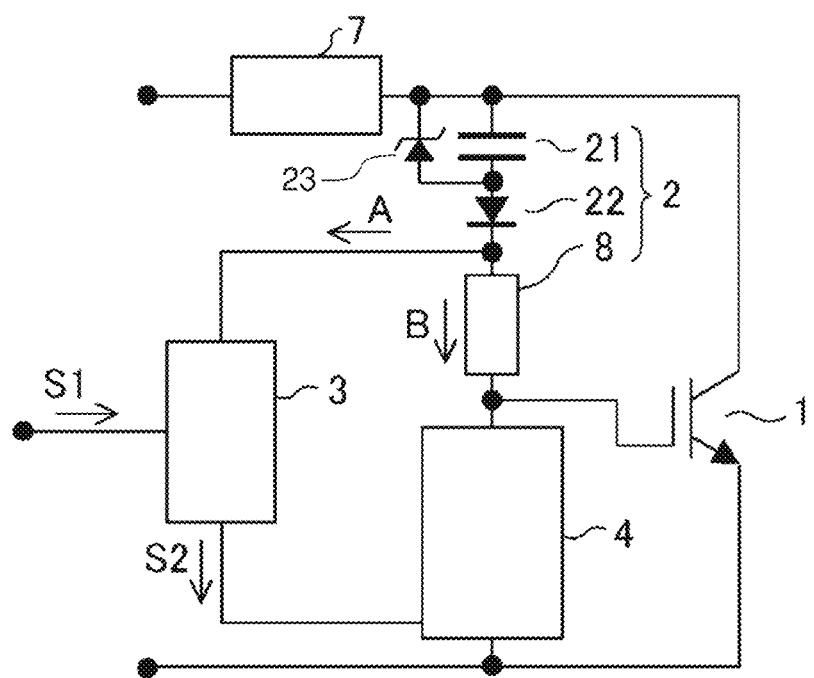
FIG. 4 is a diagram showing a configuration example of a detection circuit of a drive circuit for a semiconductor switching device in Embodiment 2.

FIG. 4 shows a configuration example of a detection circuit in a drive circuit for a semiconductor switching device in Embodiment 2. In the detection circuit 2 in Embodiment 2, a resistor 8 serving as a current detector is connected to a series circuit of a capacitor 21 and a diode 22.

Further, the detection circuit 2 includes a Zener diode or a varistor 23 as a voltage detector. The voltage detector 23 is connected in parallel with the capacitor 21. The voltage of the capacitor 21 of the detection circuit 2 is held at the voltage Vdc by the voltage detector 23. When the voltage of the capacitor 21 exceeds the voltage Vdc, the adjustment current B is supplied, and the gate current at the off time is controlled by the adjustment current B. The control circuit 3 detects by the feedback signal A from the detection circuit 2 that the adjustment current B is outputted, and detects that the switching of the IGBT 1 has been performed normally.

Note that the detection level of the voltage of the capacitor 21 is not limited to the voltage Vdc, and should be equal to or lower than an allowable voltage of the bus capacitor 6 or the IGBT 1. The resistor 8 is an example of a current detector in which a voltage between both ends of the resistor 8 is generated when the adjustment current B is outputted. The current detector outputs the voltage signal to the control circuit 3 as the feedback signal A, and may be configured with a plurality of resistors. Alternatively, the feedback signal A may be outputted by detecting the presence or absence of the adjustment current B of the detection circuit 2 using a voltage Vak between the electrodes of the diode 22 without using the resistor 8.

The diode 22 controls the voltage of the capacitor 21, and when the diode 22 is turned off, the capacitor 21 is charged to be at the voltage Vdc. In addition, when the diode 22 is turned on, the capacitor 21 is prevented from being discharged, and the gate current Ig is prevented from charging the capacitor 21 to interfere with the driving of the IGBT 1.

In the circuit configuration of Embodiment 2, when the voltage Vcg of the feedback part of the IGBT 1 exceeds the voltage Vdc at the off time of switching, the diode 22 is turned on, and the adjustment current B is supplied to the gate of the IGBT 1 via the resistor 8. In addition, the control circuit 3 detects a voltage drop in the resistor 8 due to the supply of the adjustment current B as the feedback signal A, and can recognize that the switching is performed normally. Accordingly, the control circuit 3 can detect whether or not the switching is performed by detecting a change in the voltage Vce in the circuit with the emitter reference, and can diagnose a failure of the IGBT 1.

Embodiment 3

Figure 5:
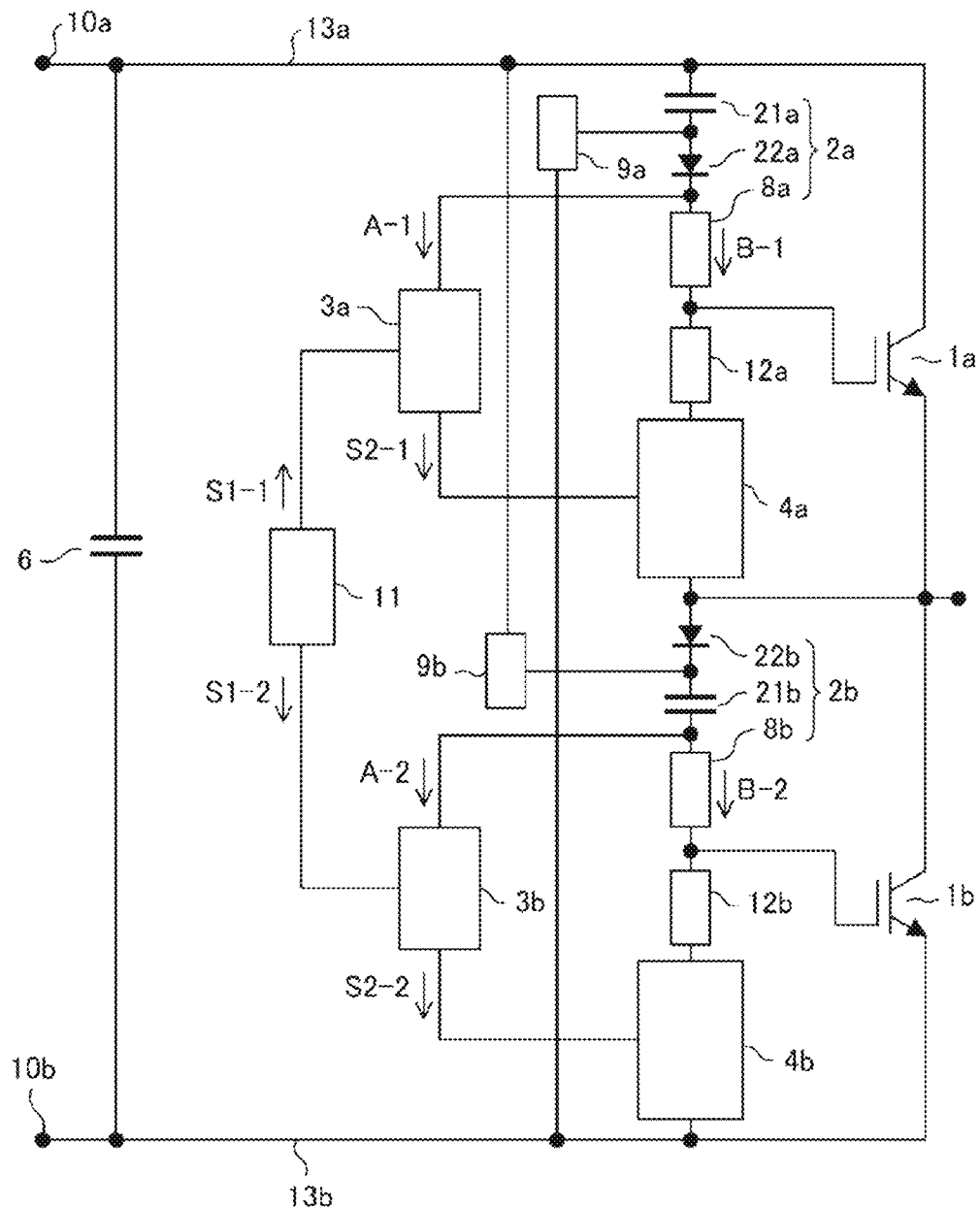
FIG. 5 is a diagram showing a configuration example of a detection circuit of a drive circuit for a semiconductor switching device according to Embodiment 3.

FIG. 5 shows a configuration example of a detection circuit of a drive circuit for a semiconductor switching device according to Embodiment 3. In Embodiment 3, descriptions will be given for a circuit that drives the IGBT 1a and the IGBT 1b forming one arm on a P side and one arm on an N side, respectively. A signal source 11 outputs isolated switching signals S1-1 and S1-2, and the switching signal S1-1 is inputted to a control circuit 3a on the P side and the switching signal S1-2 is inputted to a control circuit 3b on the N side.

In a detection circuit 2a connected between the collector and the gate of the IGBT 1a, a resistor 8a as a current detector for detecting an adjustment current B-1 is connected to a series circuit of a capacitor 21a and a diode 22a. Further, a gate resistor 12a is connected between a gate drive circuit 4a on the P side and the gate of the IGBT 1a; that is, the gate drive circuit 4a is connected, via the gate resistor 12a, to the gate of the IGBT 1a and the output side of the detection circuit 2a.

Similarly, in a detection circuit 2b connected between the collector and the gate of the IGBT 1b, a resistor 8b for detecting an adjustment current B-2 is connected to a series circuit of a capacitor 21b and a diode 22b. Further, a gate resistor 12b is connected between the gate of a gate drive circuit 4b on the N side and the gate of the IGBT 1b; that is, the gate drive circuit 4b is connected, via the gate resistor 12b, to the gate of the IGBT 1b and the output side of the detection circuit 2b.

In addition, a charging resistor 9a, which is a charging resistor unit, is connected between the capacitor 21a and the diode 22a in the detection circuit 2a on the P side, and the charging resistor 9a is connected to an N side bus 13b. Similarly, a charging resistor 9b is connected between the capacitor 21b and the diode 22b in the detection circuit 2b on the N side, and the charging resistor 9b is connected to a P side bus 13a.

That is, the capacitors 21a and 21b of the detection circuits 2a and 2b are respectively connected in parallel to the bus capacitor 6 via a charging resistors 9a and 9b. In this way, the capacitors 21a and 21b of the detection circuits 2a and 2b are connected via the charging resistors 9a and 9b, respectively, to respective wires of the DC bus to which the corresponding IGBTs 1a and 1b are not connected. Therefore, the voltage across both ends of the capacitor 21a is maintained at the bus voltage, and the voltage across the capacitor 21b is maintained at the potential difference between the bus voltage and a voltage in a negative control power supply of the gate drive circuit 4b. Here, in the power supply for the gate drive circuit 4b, the gate drive circuit 4b needs a power supply of a negative voltage for drawing electric charges from the gate when IGBT 1b is turned off, and thus this negative voltage power supply is referred to as the negative control power supply. In the power supply for the gate drive circuit 4a, a negative control power supply to draw charges from the gate of the IGBT 1a is also provided.

The control circuit 3a on the P side outputs an on/off signal S2-1 to the gate drive circuit 4a on the P side on the basis of the switching signal S1-1 inputted from the signal source 11 and a feedback signal A-1 being the output from the detection circuit 2a. Similarly, the control circuit 3b on the N side outputs an on/off signal S2-2 to the gate drive circuit 4b on the N side on the basis of the switching signal S1-2 inputted from the signal source 11 and a feedback signal A-2 being the output from the detection circuit 2b.

According to the circuit configuration of Embodiment 3, since the capacitors 21a and 21b of the detection circuits 2a and 2b are maintained at the voltage Vdc regardless of a switching frequency or a duty ratio, it is possible to prevent erroneous detection due to the charging currents to the capacitors 21a and 21b. Accordingly, it is possible to avoid a situation in which the failure diagnosis cannot be performed in the control circuits 3a and 3b or a situation in which the switching is delayed more than necessary and a large loss occurs.

In addition, since the resistors 8a and 8b as the current detectors are connected to the gates of the IGBT 1a and 1b, respectively, the control circuits 3a and 3b can directly detect the feedback signals A-1 and A-2 with the emitter references of the IGBT 1a and the IGBT 1b, respectively, and a high-speed control response can be achieved with a simple circuit configuration. Further, the voltages of both the capacitor 21a on the P side and the capacitor 21b on the N side can be held at the voltage Vdc, and the detection level can be maintained at a constant value.

Embodiment 4

Figure 6:
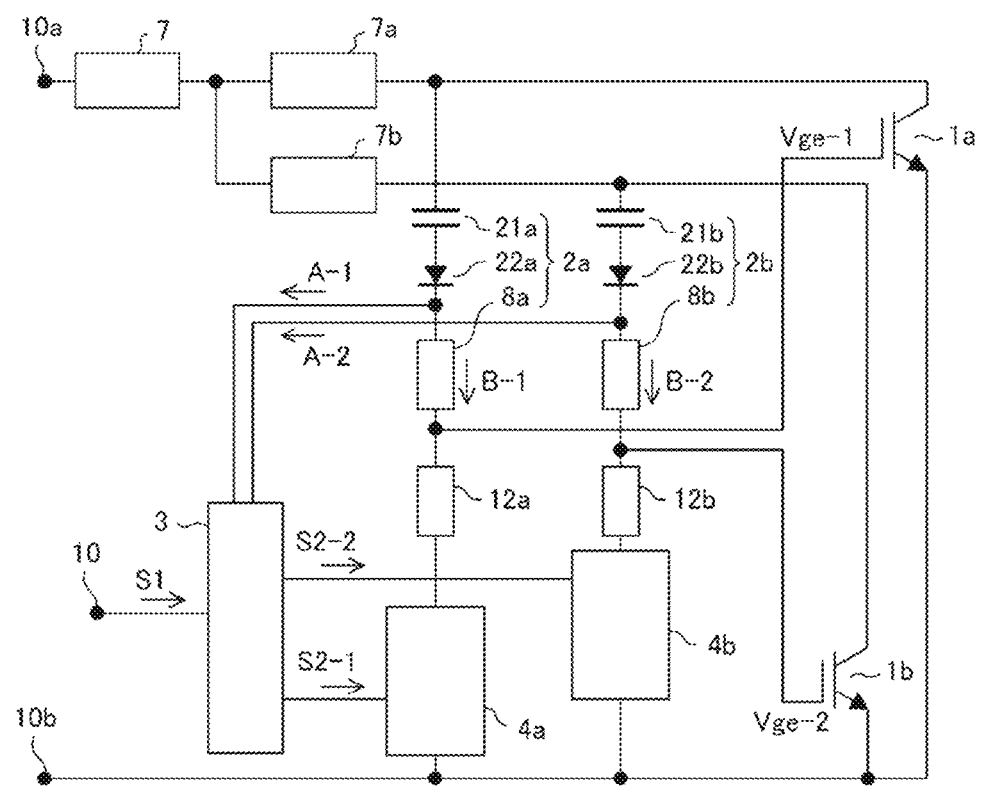
FIG. 6 is a diagram showing a configuration example of a detection circuit of a drive circuit for a semiconductor switching device according to Embodiment 4.

FIG. 6 shows a configuration example of a detection circuit of a drive circuit for a semiconductor switching device according to Embodiment 4.

The drive circuit for the semiconductor switching device according to Embodiment 4 includes the IGBT 1a and the IGBT 1b as a plurality of the switching devices connected in parallel, and a plurality of the detection circuits 2a and 2b that output the feedback signals A-1 and A-2 and the adjustment currents B-1 and B-2 for IGBT 1a and the IGBT 1b, respectively.

In a parallel module as shown in FIG. 6, the control circuit 3 adjusts the on/off signals S2-1 and S2-2 corresponding to the respective IGBTs 1a and 1b on the basis of the feedback signals A-1 and A-2 corresponding to the respective IGBTs 1a and 1b, and has a function of adjusting one or both of the magnitudes and the timings of the gate currents of the respective IGBTs 1a and 1b. This function will be described in Embodiment 4.

In the detection circuit 2a connected between the collector and the gate of the IGBT 1a, a resistor 8a for detecting the adjustment current B-1 is connected to a series circuit of the capacitor 21a and the diode 22a. Further, the gate resistor 12a is connected between the gate drive circuit 4a and the gate of the IGBT 1a. That is, the gate drive circuit 4a is connected to the gate of the IGBT 1a and the output side of the detection circuit 2a via the gate resistor 12a.

Similarly, in the detection circuit 2b connected between the collector and the gate of the IGBT 1b, a resistor 8b for detecting the adjustment current B-2 is connected to a series circuit of the capacitor 21b and the diode 22b. Further, the gate resistor 12b is connected between the gate drive circuit 4b and the gate of the IGBT 1b. That is, the gate drive circuit 4b is connected to the gate of the IGBT 1b and the output side of the detection circuit 2b via the gate resistor 12b.

The switching signal S1, and the feedback signals A-1 and A-2 that are the outputs of the detection circuits 2a and 2b, are inputted to the control circuit 3. The control circuit 3 adjusts the on/off signal S2-1 for the IGBT 1a on the basis of the feedback signal A-1, and outputs the adjusted on/off signal to the gate drive circuit 4a. The gate drive circuit 4a controls the gate current of the IGBT 1a on the basis of the waveform of the on/off signal S2-1 to control a gate voltage Vge-1.

Similarly, the control circuit 3 adjusts the on/off signal S2-2 for the IGBT 1b on the basis of the feedback signal A-2 and outputs the adjusted on/off signal to the gate drive circuit 4b. The gate drive circuit 4b controls the gate current of the IGBT 1b on the basis of the waveform of the on/off signal S2-2 to control a gate voltage Vge-2.

In addition, the wire inductor 7 and a wire inductor 7a are present between the collector of the IGBT 1a and the input terminal 10a, and the wire inductor 7 and a wire inductor 7b are present between the collector of the IGBT 1b and the input terminal 10a. The wire inductors 7a and 7b are assumed to be wiring in the devices of the IGBT 1a and the IGBT 1b. Note that a wire inductor is also present between each of the emitters and the input terminal 10b, but are not shown in the figure.

When a plurality of the IGBTs 1a and 1b are connected in parallel as in the drive circuit for the semiconductor switching device according to Embodiment 4, a time difference may occur between the on/off signals S2-1 and S2-2 due to a characteristic difference of the control circuit 3, a characteristic difference of the gate drive circuits 4a and 4b or deterioration, etc., and thus the switching in the IGBT 1a and the IGBT 1b may not be performed at the same time.

Using FIG. 7, a waveform in each of parts in such a case above will be described. In the example shown in FIG. 7, when an off signal is inputted as the switching signal S1 (t0 in the figure), an off signal S2-1, which is an off command to the IGBT 1a, is outputted (t1 in the figure), and an off signal S2-2 to the IGBT 1b is outputted (t2 in the figure) with a delay. As a result, the gate voltage Vge-1 of the IGBT 1a is turned off first, and the gate voltage Vge-2 of the IGBT 1b is turned off with a delay.

Thus, a part of the collector current Ic-1 flowing through the IGBT 1a is commutated to the IGBT 1b due to the wire inductors 7 and 7a, and the collector current Ic-2 for cutting off the IGBT 1b becomes larger than the collector current Ic-1. Accordingly, differences in the magnitude and timing occur between a surge voltage generated in the voltage Vice-1 of the IGBT 1a and a surge voltage generated in the voltage Vce-2 of the IGBT 1b.

As a result, the feedback signals A-1 and A-2 having different magnitudes are inputted to the control circuit 3 at different timings. Thus, the control circuit 3 detects that there is a time difference between the on/off signals S2-1 and S2-2, and adjusts the on/off signals S2-1 and S2-2 on the basis of the feedback signals A-1 and A-2 so that the collector currents Ic-1 and Ic-2 for cutting off two IGBTs 1a and 1b become equal to each other.

In addition, the control circuit 3 can also estimate the temperature of each of the IGBT 1a and the IGBT 1b on the basis of the feedback signals A-1 and A-2 corresponding to respective IGBTs 1a and 1b, and can adjust one or both of the magnitude and the timing of the gate voltage of each of the IGBTs 1a and 1b. The control circuit 3 detects the temperature difference between the IGBT 1a and the IGBT 1b on the basis of the difference between the feedback signals A-1 and A-2 without measuring the device temperatures.

Figure 8:
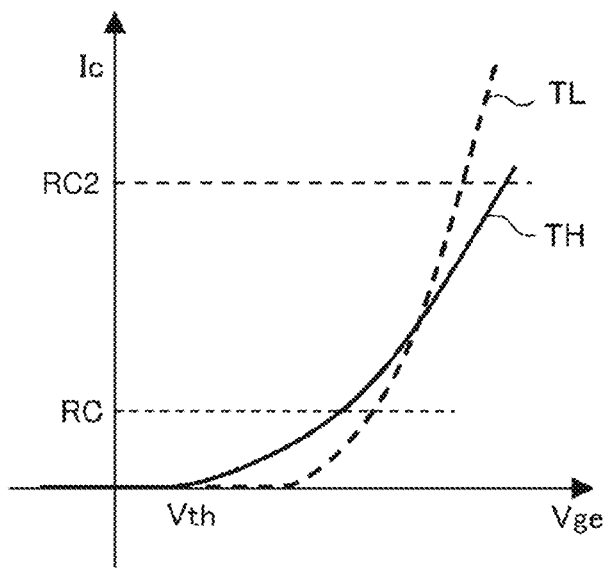
FIG. 8 is a graph showing temperature characteristics of the semiconductor switching device according to Embodiment 4.

FIG. 8 shows a difference in transfer characteristics depending on the temperature of an IGBT. In FIG. 8, the horizontal axis represents the gate voltage Vge, the vertical axis represents the collector current Ic, a curve TH indicated by a solid line represents the transfer characteristic of an IGBT having a high temperature, and a curve TL indicated by a dotted line represents the transfer characteristic of an IGBT having a low temperature. For example, in a region in which the collector current Ic is a small current such as RC in FIG. 8, an IGBT has a characteristic in which a larger current flows in an device having a high temperature than in an device having a low temperature even when the gate voltage is the same.

The detection circuits 2a and 2b output the feedback signals A-1 and A-2 corresponding to the magnitudes of the collector currents of the IGBTs 1a and 1b, The control circuit 3 adjusts the on/off signals S2-1 and S2-2 so as to reduce the loss in the device having a high temperature on the basis of the difference between the feedback signals A-1 and A-2. Further, at the time of switching of a large collector current Ic (for example, RC2 in FIG. 8), due to the difference in the transfer characteristics, the device having a low temperature has a characteristic in which the current flows more easily than the device having a high temperature. In this case, the gate signals are not controlled in terms of balancing the device temperatures, but in order to suppress an anomaly voltage such as an overvoltage of Vce, it is necessary to control branch currents to the devices to be equal to each other. In this case, the control circuit 3 adjusts the on/off signals S2-1 and S2-2 so as to reduce the switching current of the device having a low temperature.

Figure 7:
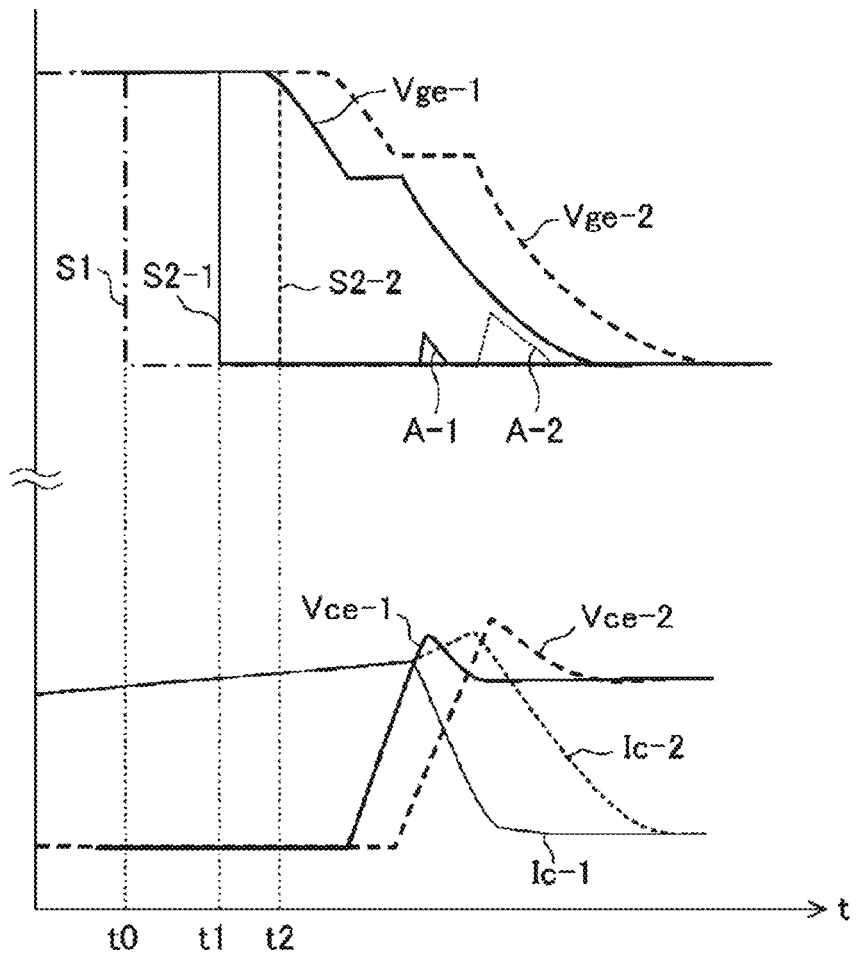
FIG. 7 is a diagram showing a waveform in each of parts in the drive circuit for the semiconductor switching device according to Embodiment 4.

Note that the cause of the temperature difference between the two IGBTs 1a and 1b may be owing to the difference of the delay time in the on/off signals S2-1 and S2-2 described in FIG. 7, or the difference in the wire inductors 7a and 7b, as well as the difference in heat dissipation due to the difference in the mounting conditions of the IGBTs 1a and 1b. Thus, the temperatures of the plurality of the IGBTs 1a and 1b in the parallel module can be balanced by actively controlling the on/off signals S2-1 and S2-2 and adjusting the load for each IGBT.

Note that methods of adjusting the switching timing include adjustment of the timing of the on/off signals S2-1 and S2-2 (for example, delaying the on/off signal S2-1 and advancing the on/off signal S2-2), adjustment of the gate amplitudes (for example, lowering the amplitude of the on/off signal S2-1 and raising the amplitude of the on/off signal S2-2), as well as switching of the gate waveforms, controlling of voltage change rates (dVge/dt) of the on/off signals S2-1 and S2-2 at the time of rising, and switching of the gate resistance values.

According to the drive circuit of the semiconductor switching device in Embodiment 4, in the circuit including the plurality of the IGBTs 1a and 1b connected in parallel, the on/off signals S2-1 and S2-2, and the magnitude and/or the timing of the gate current of each of the IGBTs 1a and 1b are adjusted on the basis of the respective feedback signals A-1 and A-2. This enables the currents for cutting off the IGBTs 1a and 1b to be equalized and the losses generated in the IGBTs 1a and 1b to be equalized, and the switching noise or surge voltage peaks to be reduced.

In addition, by estimating the temperatures of the plurality of the IGBTs 1a and 1b on the basis of the feedback signals A-1 and A-2 and adjusting the magnitude and/or the timing of the gate current of each of the IGBTs 1a and 1b, it is possible to equalize the losses occurring in the IGBTs 1a and 1b and to balance the temperatures.

Embodiment 5

In Embodiment 5, a diagnosis method will be described when an IGBT is partially deteriorated or partially failed in a circuit in which the plurality of the IGBTs is connected in parallel. Since the configuration of a drive circuit of a semiconductor switching device in Embodiment 5 is the same as that in Embodiment 4, FIG. 6 is used, and the description of each component is omitted.

In the parallel module, the control circuit 3 detects variations in the magnitudes of the feedback signals A-1 and A-2 corresponding to the respective IGBTs 1a and 1b, and diagnoses which IGBT in the plurality of the IGBTs 1a and 1b is deteriorated or failed on the basis of each of the feedback signals A-1 and A-2. Note that the control circuit 3 may output an anomaly signal (not illustrated) to the outside when detecting the variations in the magnitudes of the feedback signals A-1 and A-2.

For example, when the IGBT 1a of one side is deteriorated, a difference occurs in static characteristics between the IGBT 1b of the other side and the IGBT 1a, or a difference occurs in impedance between the wire inductors 7a and 7b owing to partial chipping or disconnection in bonding wires, or creep of a solder or the like within IGBT 1a. This causes a difference in the change rate dIc/dt of the collector current Ic, a difference in the magnitude of the gate current Ig or a change rate dIg/dt thereof, resulting in a difference in the switching time. The collector current Ic of the deteriorated IGBT 1a decreases, and a difference occurs in the branch currents of the collector current Ic between the two IGBTs 1a and 1b.

Figure 9:
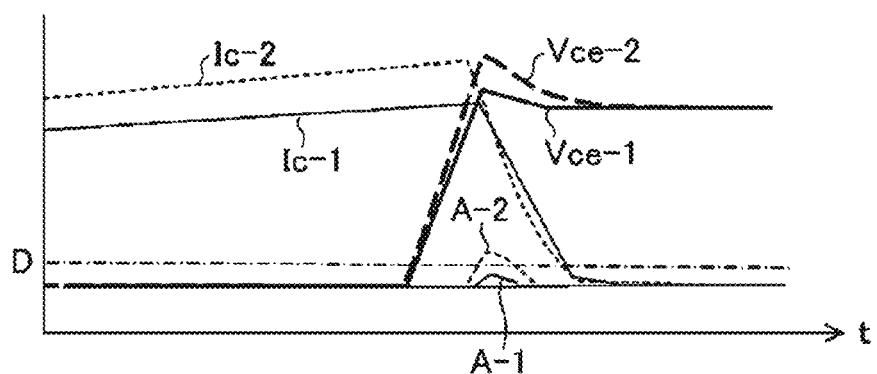
FIG. 9 is a diagram showing drive waveforms for a semiconductor switching device in Embodiment 5.

In the circuit illustrated in FIG. 6 in which the two IGBTs 1a and 1b are connected in parallel, drive waveforms in a case where the IGBT 1a is deteriorated will be described with reference to FIG. 9. In the example illustrated in FIG. 9, it is assumed that there is no difference in the device temperature between the two IGBTs 1a and 1b in the initial state and there is no difference in the impedance between the wire inductors 7a and 7b. When deterioration occurs in the IGBT 1a from this initial state, the collector current Ic-1 of the IGBT 1a decreases, and the voltage Vice-1 becomes smaller than the voltage Vce-2.

As a result, the feedback signal A-2, which is the detection value of the voltage Vce-2 of the IGBT 1b, exceeds the detection level (indicated by D in the figure), whereas the feedback signal A-1, which is the detection value of the voltage Vice-1, does not reach the detection level. Therefore, the detection circuit 2b corresponding to the IGBT 1b outputs the feedback signal A-2, but the detection circuit 2a corresponding to the IGBT 1a does not output the feedback signal A-1. Since the feedback signal A-2 is inputted only from the detection circuit 2b, the control circuit 3 diagnoses that the IGBT 1a is deteriorated and adjusts the switching timing, the amplitude of the voltage Vge, and the like to improve the branch currents.

According to Embodiment 5, in the circuit in which the plurality of the IGBTs 1a and 1b is connected in parallel, it is possible to identify which IGBT 1a or IGBT 1b has failed or deteriorated with a simple circuit configuration without individually detecting the collector current Ic, the voltage Vce, and the like in each of the IGBTs 1a and 1b. In addition, it is possible to improve the difference in the branch currents between the plurality of the IGBTs 1a and 1b to equalize the loss, or to suppress the peak of the voltage Vce at the off time, and thus, it is possible to efficiently use the IGBTs 1a and 1b.

Embodiment 6

In Embodiment 6, in a circuit in which the plurality of the IGBTs is connected in parallel, a diagnostic method will be described in a case where any of the IGBTs is in the open fault. Since the configuration of a drive circuit of a semiconductor switching device in Embodiment 6 is the same as that in Embodiment 4, FIG. 6 is used, and the description of each component is omitted.

Figure 10:
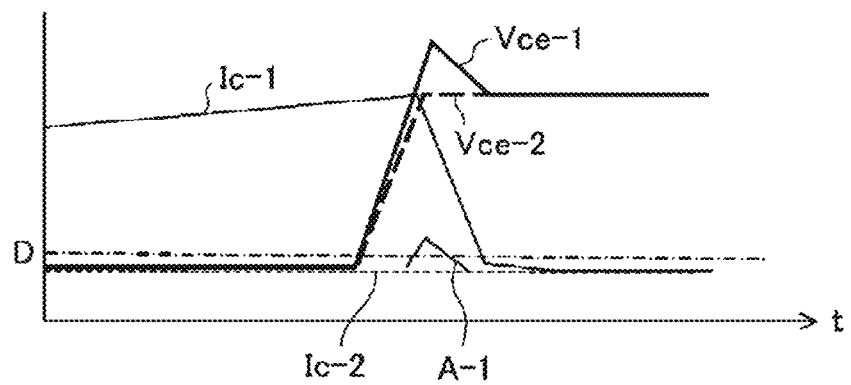
FIG. 10 is a diagram showing drive waveforms of a semiconductor switching device in Embodiment 6.

FIG. 10 shows drive waveforms of the semiconductor switching device in Embodiment 6. In the example shown in FIG. 10, when the detection level (indicated by D in the figure) of the feedback signal A is set to the voltage Vdc and only the feedback signal A-1 of the IGBT 1a is detected even when the switching timing or the like is adjusted, the control circuit 3 diagnoses that the IGBT 1b has an open failure.

In addition, if only the feedback signal A-1 of the IGBT 1a is detected in the switching at a small current level in which normally an overcurrent is not detected, the on/off signal S2-2 is adjusted to the maximum range. Even in that case when the feedback signal A-2 is not detected, the control circuit 3 diagnoses that IGBT 1b has a failure.

Further, even if the collector current Ic has such a magnitude not to be detected when the branch currents are normal, the current is concentrated in the IGBT 1a due to, for example, a failure of the IGBT 1b, and whereby the feedback signal A-1 may reach the detection level and be detected. Thus, the control circuit 3 detects that the IGBT 1b has a failure or has been deteriorated to reach the end of its life.

According to Embodiment 6, in the circuit in which the plurality of the IGBTs is connected in parallel as in IGBTs 1a and 1b, it is possible to detect which IGBT has a failure or has reached the end of its life on the basis of the presence or absence of the feedback signals A-1, A-2 or the variations in the magnitudes thereof without individually detecting the collector currents Ic-1 and Ic-2 of the IGBTs 1a and 1b as in the typical conventional method. Although the case where two devices are connected in parallel has been described above, even in the case where three or more devices are connected in parallel, by detecting that only a specific device is not detected in consideration of the number of devices connected in parallel among the devices or the variations in the branch currents, it is possible to detect that whether a failure has occurred, or a device or wiring has deteriorated.

Embodiment 7

Figure 11:
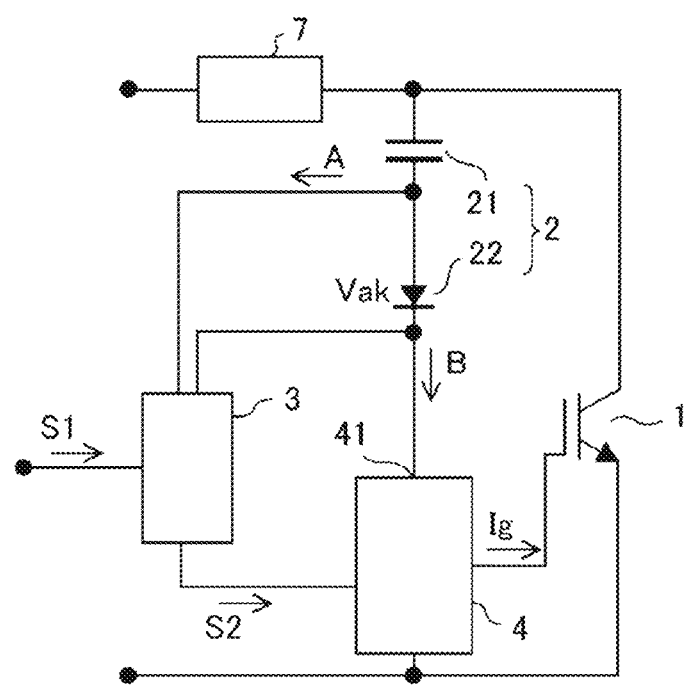
FIG. 11 is a diagram showing a configuration example of a drive circuit for a semiconductor switching device according to Embodiment 7.

FIG. 11 shows a configuration example of a drive circuit for a semiconductor switching device according to Embodiment 7. In Embodiment 7, the adjustment current B is inputted to the gate drive circuit 4 from the detection circuit 2, and the gate drive circuit 4 adjusts one or both of the magnitude and the timing of the gate current of the IGBT 1 on the basis of the adjustment current B and the on/off signal S2.

In addition, the diode 22 of the detection circuit 2 is connected to the capacitor 21 and a negative control power supply (hereinafter, referred to as a negative power supply 41) of the gate drive circuit 4. In the gate drive circuit 4, a power supply of a negative voltage is necessary in order to draw charges from the gate when the gate drive circuit 4 turns off the IGBT 1, and this power supply is referred to as the negative power supply 41. The detection circuit 2 detects an anode-cathode voltage Vak (hereinafter, voltage Vak) of the diode 22, outputs the voltage Vak as the feedback signal A, and outputs information on the current direction. In the configuration of the embodiments described above, the detection circuit 2 is connected between the collector and the gate so as to detect the voltage Vcg between the collector and the gate, the collector being the high-voltage side main terminal of the IGBT 1, and the adjustment current B is directly added to the output of the gate drive circuit 4. In the configuration of Embodiment 7, the output of the adjustment current B of the detection circuit 2 is only connected to the negative power supply 41, and the adjustment current B is consumed by the negative power supply 41 and is not directly added to the output of the gate drive circuit 4. According to this configuration, the detection circuit 2 is configured to detect the collector-emitter voltage Vce, the corrector being the high-voltage side main terminal of the IGBT 1. In this way, the detection circuit 2 is not limited to the configuration to detect Vcg, but it may detect Vce. That is, the detection circuit 2 may be configured to detect Vcg (voltage between high-voltage side main terminal and gate) (Embodiment 1 to Embodiment 6) or configured to detect Vce (voltage between main terminals) (Embodiment 7), Vcg being the voltage at the collector of the IGBT 1, that is, at the high-voltage side main terminal of the semiconductor switching device.

The control circuit 3 detects whether or not a current is supplied through the diode 22 at the time of switching, that is, whether or not the adjustment current B is outputted, by the feedback signal A. The control circuit 3 detects that the switching of the IGBT 1 is performed on the basis of the information of the current direction and the feedback signal A, and adjusts the gate current Ig supplied to the IGBT 1.

Figure 12:
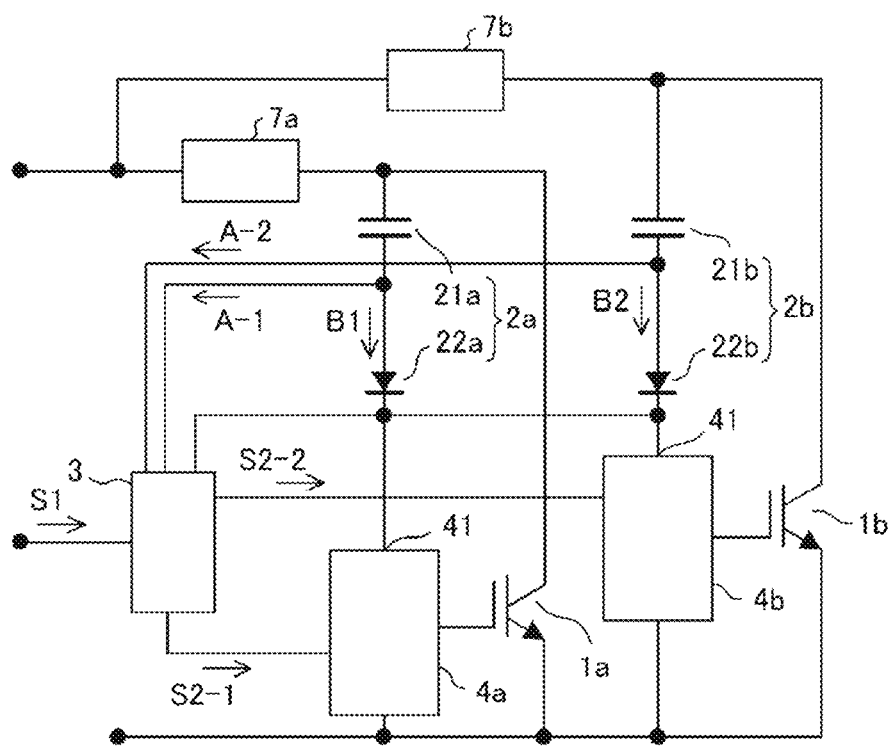
FIG. 12 is a diagram showing a configuration example of a drive circuit in a case where semiconductor switching devices are connected in parallel in Embodiment 7.

FIG. 12 shows a configuration example of a drive circuit when IGBTs are connected in parallel in Embodiment 7. The detection circuits 2a and 2b are connected to the collectors of the IGBTs 1a and 1b and the negative power supplies 41 of the gate drive circuits 4a and 4b, respectively.

With such a configuration, when voltages equal to or higher than the voltages of the capacitors 21a and 21b are applied to the feedback parts of the IGBTs 1a and 1b due to the induced voltages of the wire inductors 7a and 7b generated at the time of switching, the adjustment currents B-1 and B-2 flow. Therefore, even in a case where the IGBTs 1a and 1b are connected in parallel, the feedback signals A-1 and A-2 can be detected with reference to the negative power supply 41. The control circuit 3 detects the magnitudes of the feedback signals A-1 and A-2 and a difference in the timings thereof and adjust each of the gate currents Ig.

In the circuit configuration shown in FIG. 12, the operation of the control circuit 3 when the IGBT 1a has an open failure will be described. In a normal state, the control circuit 3 detects each of the feedback signals A-1 and A-2 to adjust the gate currents Ig. In the case where an open failure occurs in the IGBT 1a, the diode 22a is turned on after the control circuit 3 outputs the off signal to the gate drive circuit 4a, so that the adjustment current B-1 is not detected and the feedback signal A-1 is not outputted. On the other hand, since the adjustment current B-2 is detected and the feedback signal A-2 is outputted, the control circuit 3 recognizes that the direction of the collector current Ic-2 is the positive direction.

The control circuit 3 diagnoses that the IGBT 1a has a failure on the basis of these two pieces of information. In such a failure diagnosis, by detecting that the same state is repeated several times, it is possible to prevent erroneous detection due to a difference in the branch currents between the IGBTs 1a and 1b, etc., and it is possible to perform an accurate diagnosis. In addition, although the circuit including the two IGBTs, i.e., the IGBTs 1a and 1b, has been described, the detection accuracy can be improved by detecting the current directions and the current magnitudes on the basis of the feedback signals A of the plurality of the IGBTs in order to detect the current direction.

According to Embodiment 7, the control circuit 3 can detect the flow of the adjustment current B with reference to the negative power supply 41 without the adjustment current B to flow through the gate of each of the IGBTs 1a and the 1b. In addition, by adjusting the on/off signals S2-1 and S2-2 according to the magnitudes of the adjustment currents B to adjust the gate currents Ig, the switching can be improved.

Embodiment 8

Figure 13:
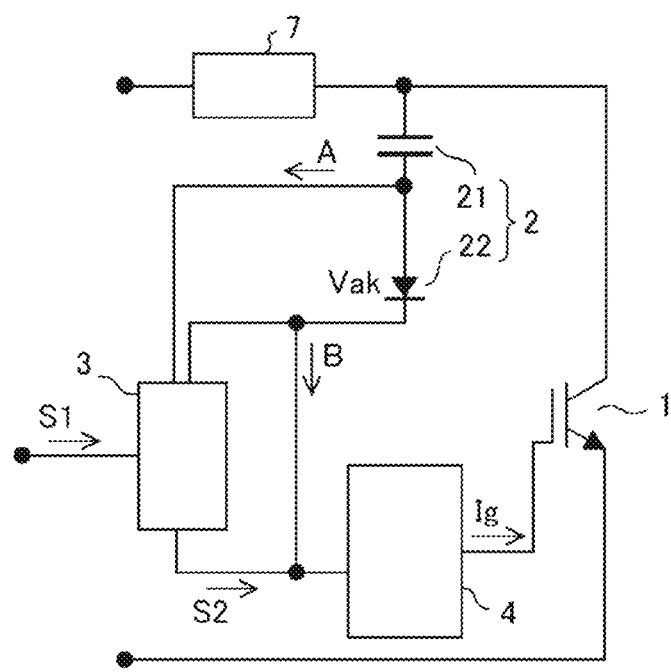
FIG. 13 is a diagram showing a configuration example of a drive circuit for a semiconductor switching device according to Embodiment 8.

FIG. 13 shows a configuration example of a drive circuit for a semiconductor switching device according to Embodiment 8. In Embodiment 8, the detection circuit 2 and the input side of the gate drive circuit 4 are connected to each other, and the on/off signal S2 inputted to the gate drive circuit 4 is adjusted by the adjustment current B. That is, the gate drive circuit 4 controls the gate current Ig by the on/off signal S2 adjusted on the basis of the adjustment current B.

With such a configuration, the gate current Ig is adjusted by the on/off signal S2 that is adjusted by the adjustment current B, and thus the adjustment current B is amplified by the gate drive circuit 4. Accordingly, it is possible to control a large-capacity IGBT 1 with a small adjustment current B, and it is possible to make the capacities of the capacitor 21 and the diode 22 in the detection circuit 2 smaller than those in the other embodiments. According to Embodiment 8, it is possible to improve the switching of the IGBT 1 by the drive circuit of the semiconductor device having a smaller capacity than those in the other embodiments.

Although the case with the single switching device has been described above, the configuration of FIG. 13 can also be applied to the case where a plurality of the devices is connected in parallel as shown in FIG. 6. In this case, the adjustment currents B flow into the on/off signals S2 being the inputs to the gate drive circuits 4, respectively, and are adjusted and amplified by the gate drive circuit 4 to control the gate current Ig. Therefore, a configuration can be implemented to suppress the anomaly voltages of Vce due to the respective wire inductors 7 by the respective small adjustment currents B.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1, 1a, 1b: IGBT, 2, 2a, 2b: detection circuit, 3, 3a, 3b: control circuit, 4, 4a, 4b: gate drive circuit, 5: load, 6: bus capacitor, 7, 7a, 7b: wire inductor, 8, 8a, 8b: resistor, 9a, 9b: charging resistor, 10, 10a, 10b: input terminal, 11: signal source, 12a, 12b: gate resistor, 13a: P side bus, 13b: N side bus, 20: feedback part, 21, 21a, 21b: capacitor, 22, 22a, 22b: diode, 31: failure diagnostic circuit, 41: negative power supply

The invention claimed is:

1. A drive circuit for a semiconductor switching device, the drive circuit comprising:
a control circuit to output a drive signal to the semiconductor switching device in synchronization with an input signal;
a gate drive circuit to drive the semiconductor switching device on a basis of the drive signal; and
a detection circuit to output a feedback signal and an adjustment current when a voltage of a high-voltage side main terminal of the semiconductor switching device is equal to or higher than a preset threshold value in a period in which the gate drive circuit turns off the semiconductor switching device to cut off a current, wherein
the detection circuit includes a capacitor connected to the high-voltage side main terminal, a diode which is connected in series with the capacitor and whose anode terminal is connected on a side of the high-voltage side main terminal, and a resistor connected in series with the diode, and outputs a voltage at a connection point between the diode and the resistor as the feedback signal,
the control circuit diagnoses a state of the semiconductor switching device or controls a signal to be outputted to the gate drive circuit on a basis of the feedback signal, and
a gate current that is an output of the gate drive circuit is adjusted by the adjustment current.

2. The drive circuit for the semiconductor switching device according to claim 1, wherein the control circuit diagnoses that the semiconductor switching device has an open failure when the feedback signal is not detected in the period in which the gate drive circuit turns off the semiconductor switching device to cut off the current.

3. The drive circuit for the semiconductor switching device according to claim 1, wherein the control circuit estimates one or both of a magnitude and a change rate of a current flowing through the semiconductor switching device on a basis of the feedback signal, and diagnoses deterioration or a failure of the semiconductor switching device.

4. The drive circuit for the semiconductor switching device according to claim 1, wherein the control circuit estimates a delay time from the drive signal in switching of the semiconductor switching device on a basis of the feedback signal, and diagnoses deterioration and a failure of the semiconductor switching device.

5. The drive circuit for the semiconductor switching device according to claim 1, wherein the control circuit holds an output of the gate drive circuit in an off state when detecting a failure of the semiconductor switching device.

6. The drive circuit for the semiconductor switching device according to claim 1, wherein a Zener diode or a varistor is connected in parallel with the capacitor.

7. The drive circuit for the semiconductor switching device according to claim 1, wherein the gate drive circuit is connected to a gate of the semiconductor switching device via a gate resistor and an output side of the detection circuit for outputting the adjustment current.

8. The drive circuit for the semiconductor switching device according to claim 1, wherein
the gate drive circuit adjusts one or both of a magnitude and a timing of a gate current of the semiconductor switching device on a basis of the drive signal and the adjustment current.

9. The drive circuit for the semiconductor switching device according to claim 1, wherein an output of the adjustment current of the detection circuit is inputted to the gate drive circuit, and the drive signal inputted to the gate drive circuit is adjusted by the adjustment current.

10. The drive circuit for the semiconductor switching device according to claim 1, further comprising:
a plurality of the semiconductor switching devices connected in parallel; and
a plurality of the detection circuits to output feedback signals and adjustment currents corresponding to the respective semiconductor switching devices.

11. The drive circuit for the semiconductor switching device according to claim 10, wherein the control circuit adjusts one or both of a magnitude and a timing of a gate current of each semiconductor switching device on a basis of the feedback signals corresponding to the respective semiconductor switching devices.

12. The drive circuit for the semiconductor switching device according to claim 10, wherein the control circuit estimates a temperature of each semiconductor switching device on a basis of the feedback signals corresponding to the respective semiconductor switching devices and adjusts one or both of a magnitude and a timing of a gate current of each semiconductor switching device.

13. The drive circuit for the semiconductor switching device according to claim 10, wherein the control circuit detects variations in magnitudes of the feedback signals corresponding to respective semiconductor switching devices, and diagnoses which semiconductor switching device among the semiconductor switching devices has deteriorated or failed on a basis of each feedback signal.

14. The drive circuit for the semiconductor switching device according to claim 10, further comprising:
a plurality of the gate drive circuits corresponding to the respective semiconductor devices, wherein
the drive signal and the adjustment current corresponding to each semiconductor switching device are input to each gate drive circuit, and one or both of a magnitude and a timing of a gate current of each semiconductor switching device are adjusted on a basis of the drive signal and the adjustment current.

15. The drive circuit for the semiconductor switching device according to claim 1, wherein
two of the semiconductor switching devices are connected in series between DC buses,
the detection circuits that output the feedback signals and the adjustment currents corresponding to the respective semiconductor switching devices are provided,
each of the detection circuits include a capacitor, a diode, and a current detector, and
each capacitor is to be charged, one terminal of each capacitor being connected to one of the DC buses to which one of the semiconductor switching devices corresponding to one of the detection circuits is connected, the other terminal of each capacitor being connected via a charging resistor to the other of the DC buses to which the semiconductor switching device corresponding to the one of the detection circuits is not connected.

16. The drive circuit for the semiconductor switching device according to claim 1, wherein the voltage at the connection point between the diode and the resistor is a voltage with reference to a voltage at a low-voltage side main terminal of the semiconductor switching device.

17. The drive circuit for the semiconductor switching device according to claim 8, wherein
an output of the adjustment current of the detection circuit is connected to a negative control power supply of the gate drive circuit.

18. The drive circuit for the semiconductor switching device according to claim 10, wherein the control circuit detects variations in timings of the feedback signals corresponding to respective semiconductor switching devices, and diagnoses which semiconductor switching device among the semiconductor switching devices has deteriorated or failed on a basis of each feedback signal.

19. A drive circuit for a semiconductor switching device, the drive circuit comprising:
a control circuit to output a drive signal to the semiconductor switching device in synchronization with an input signal;
a gate drive circuit to drive the semiconductor switching device on a basis of the drive signal; and
a detection circuit to output a feedback signal and an adjustment current when a voltage of a high-voltage side main terminal of the semiconductor switching device is equal to or higher than a preset threshold value in a period in which the gate drive circuit turns off the semiconductor switching device to cut off a current, wherein
the control circuit diagnoses a state of the semiconductor switching device or controls a signal to be outputted to the gate drive circuit on a basis of the feedback signal, and the drive circuit for the semiconductor switching device is configured such that a gate current that is an output of the gate drive circuit is adjusted by the adjustment current and comprises:
a plurality of the semiconductor switching devices connected in parallel; and
a plurality of the detection circuits to output feedback signals and adjustment currents corresponding to the respective semiconductor switching devices, wherein
the control circuit estimates a temperature of each semiconductor switching device on a basis of the feedback signals corresponding to the respective semiconductor switching devices, and adjusts one or both of a magnitude and a timing of a gate current of each semiconductor switching device.

20. A drive circuit for a semiconductor switching device, the drive circuit comprising:
a control circuit to output a drive signal to the semiconductor switching device in synchronization with an input signal;
a gate drive circuit to drive the semiconductor switching device on a basis of the drive signal; and
a detection circuit to output a feedback signal and an adjustment current when a voltage of a high-voltage side main terminal of the semiconductor switching device is equal to or higher than a preset threshold value in a period in which the gate drive circuit turns off the semiconductor switching device to cut off a current, wherein
the control circuit diagnoses a state of the semiconductor switching device or controls a signal to be outputted to the gate drive circuit on a basis of the feedback signal, and the drive circuit for the semiconductor switching device is configured such that a gate current that is an output of the gate drive circuit is adjusted by the adjustment current and comprises:
a plurality of the semiconductor switching devices connected in parallel; and
a plurality of the detection circuits to output feedback signals and adjustment currents corresponding to the respective semiconductor switching devices, wherein
the control circuit estimates variations of one or both of magnitudes and timings of the feedback signals corresponding to the respective semiconductor switching devices and estimates which semiconductor switching device among the semiconductor switching devices has deteriorated or failed on a basis of each of the feedback signals.

* * * * *